US007294447B2

(12) United States Patent
Van Damme et al.

(10) Patent No.: US 7,294,447 B2
(45) Date of Patent: Nov. 13, 2007

(54) POSITIVE-WORKING LITHOGRAPHIC PRINTING PLATE PRECURSOR

(75) Inventors: Marc Van Damme, Bonheiden (BE); Joan Vermeersch, Deinze (BE); Geert Deroover, Lier (BE)

(73) Assignee: AGFA Graphics NV, Mortsel (BE)

( * ) Notice: Subject to any disclaimer, the term of this patent is extended or adjusted under 35 U.S.C. 154(b) by 103 days.

(21) Appl. No.: 10/243,750

(22) Filed: Sep. 13, 2002

(65) Prior Publication Data

US 2003/0068578 A1 Apr. 10, 2003

Related U.S. Application Data

(60) Provisional application No. 60/329,821, filed on Oct. 16, 2001.

(30) Foreign Application Priority Data

Sep. 24, 2001 (EP) ................................ 01000495

(51) Int. Cl.
*G03F 7/004* (2006.01)

(52) U.S. Cl. .................... 430/270.1; 430/273; 430/302

(58) Field of Classification Search ................ 430/157, 430/162, 271.1, 273.1, 272.1, 302, 270.1
See application file for complete search history.

(56) References Cited

U.S. PATENT DOCUMENTS

| | | | |
|---|---|---|---|
| 4,983,501 A | 1/1991 | Ruckert | |
| 6,042,987 A * | 3/2000 | Kobayashi | 430/270.1 |
| 6,117,610 A * | 9/2000 | Sheriff et al. | 430/190 |
| 6,352,811 B1 * | 3/2002 | Patel et al. | 430/270.1 |
| 6,383,714 B1 * | 5/2002 | Nakamura et al. | 430/270.1 |
| 6,444,393 B2 * | 9/2002 | Nakamura et al. | 430/270.1 |
| 2002/0023565 A1 * | 2/2002 | Kawamura et al. | 101/453 |
| 2002/0106583 A1 * | 8/2002 | Kawamura et al. | 430/271.1 |

FOREIGN PATENT DOCUMENTS

| | | |
|---|---|---|
| DE | 31 44 657 A | 9/1982 |
| DE | 44 05 108 A | 8/1994 |
| EP | 0 332 043 A | 9/1989 |
| EP | 0 855 267 A2 | 7/1998 |
| EP | 0 913 253 A1 | 5/1999 |
| EP | 0 938 972 A1 | 9/1999 |
| WO | WO 97/39894 A1 | 10/1997 |
| WO | WO 98/08142 A1 | 2/1998 |

OTHER PUBLICATIONS

Search Report for EP 01 00 0495 (Dec. 12, 2001).

* cited by examiner

*Primary Examiner*—John S. Chu
(74) *Attorney, Agent, or Firm*—Leydig, Voit & Mayer, Ltd

(57) ABSTRACT

A lithographic printing plate precursor is disclosed which comprises (i) a support having a hydrophilic surface or which is provided with a hydrophilic layer and (ii) a coating provided thereon, the coating comprising an oleophilic layer which, upon image-wise exposure to heat or infrared light and subsequent immersion in an aqueous alkaline developer, dissolves in the developer at a higher dissolution rate in exposed areas than in unexposed areas, wherein the oleophilic layer comprises a polymer that is soluble in the developer and an organic dye in a amount sufficient to provide a visible color to the coating, characterized in that said organic dye does not reduce the dissolution rate of the unexposed areas in the developer.

By using non-inhibiting dyes, the sensitivity of the precursor upon image-wise exposure is increased.

9 Claims, No Drawings

POSITIVE-WORKING LITHOGRAPHIC PRINTING PLATE PRECURSOR

This application claims the benefit of U.S. Provisional Patent Application No. 60/329,821, filed Oct. 16, 2001, which is incorporated by reference.

FIELD OF THE INVENTION

The present invention relates to a heat-sensitive positive-working lithographic printing plate precursor that requires aqueous alkaline processing.

BACKGROUND OF THE INVENTION

Lithographic printing presses use a so-called printing master such as a printing plate which is mounted on a cylinder of the printing press. The master carries a lithographic image on its surface and a print is obtained by applying ink to said image and then transferring the ink from the master onto a receiver material, which is typically paper. In conventional lithographic printing, ink as well as an aqueous fountain solution (also called dampening liquid) are supplied to the lithographic image which consists of oleophilic (or hydrophobic, i.e. ink-accepting, water-repelling) areas as well as hydrophilic (or oleophobic, i.e. water-accepting, ink-repelling) areas. In so-called driographic printing, the lithographic image consists of ink-accepting and ink-adhesive (ink-repelling) areas and during driographic printing, only ink is supplied to the master.

Printing masters are generally obtained by the so-called computer-to-film method wherein various pre-press steps such as typeface selection, scanning, color separation, screening, trapping, layout and imposition are accomplished digitally and each color selection is transferred to graphic arts film using an image-setter. After processing, the film can be used as a mask for the exposure of an imaging material called plate precursor and after plate processing, a printing plate is obtained which can be used as a master.

A typical printing plate precursor for computer-to-film methods comprise a hydrophilic support and an image-recording layer of a photosensitive polymer layers which include UV-sensitive diazo compounds, dichromate-sensitized hydrophilic colloids and a large variety of synthetic photopolymers. Particularly diazo-sensitized systems are widely used. Upon image-wise exposure, typically by means of a film mask in a UV contact frame, the exposed image areas become insoluble and the unexposed areas remain soluble in an aqueous alkaline developer. The plate is then processed with the developer to remove the diazonium salt or diazo resin in the unexposed areas. So the exposed areas define the image areas (printing areas) of the printing master, and such printing plate precursors are therefore called 'negative-working'. Also positive-working materials, wherein the exposed areas define the non-printing areas, are known, e.g. plates having a novolac/naphtoquinone-diazide coating which dissolves in the developer only at exposed areas.

In addition to the above photosensitive materials, also heat-sensitive printing plate precursors have become very popular. Such thermal materials offer the advantage of daylight-stability and are especially used in the so-called computer-to-plate method wherein the plate precursor is directly exposed, i.e. without the use of a film mask. The material is exposed to heat or to infrared light and the generated heat triggers a (physico-)chemical process, such as ablation, polymerization, insolubilization by cross-linking of a polymer, decomposition, or particle coagulation of a thermoplastic polymer latex.

WO97/39894 and EP-A 823 327 describe positive-working heat-sensitive materials comprising a hydrophilic support and a oleophilic coating provided thereon. The coating comprises a phenolic resin and a dissolution inhibitor, i.e. a compound which reduces the solubility of the phenolic resin in an aqueous alkaline developer. The interaction between the inhibitor and the phenolic resin is disrupted by exposure to heat or infrared light and, as a result, the exposed areas of the coating dissolve faster in the developer than the non-exposed areas and a lithographic image consisting of hydrophilic (exposed) and oleophilic (non-exposed) areas is obtained. In order to provide a larger solubility differentiation between exposed and non-exposed areas, WO 99/21725, EP-A 864 420 and EP-A 950 517 disclose the use of developer resistance means such as polysiloxane compounds which are capable of preventing the aqueous alkaline developer from penetrating into the phenolic resin layer. The increased developer resistance thus obtained can be reduced by exposure to heat or infrared light and upon subsequent immersion in the developer, a positive lithographic image is obtained.

The coating of the known printing plates contain a colorant, also called contrast dye or indicator dye, in order to provide a visible image after image-wise exposure and development. Such colorants remain in the coating at printing areas and are removed, together with the coating, at non-printing areas. Most of such prior art materials are characterized by a low sensitivity and therefore require a high power during exposure.

SUMMARY OF THE INVENTION

It is an aspect of the present invention to provide a highly sensitive thermal lithographic printing plate precursor. This object is preferably achieved by the characterizing features of the invention. Advantageous embodiments and further developments will be apparent from the description of the invention provided herein.

The colorants, that are used as indicator dyes in the prior art materials, are typically organic molecules containing quaternary nitrogen atoms, or carbonyl (—CO—), sulfinyl (—SO—) or sulfonyl (—$SO_2$—) groups. Such groups have a dissolution inhibiting effect, probably due to hydrogen bridge formation with the binder(s) present in the coating such as phenolic resins. Known examples of such inhibiting dyes are the amino-substituted tri- or diarylmethane dyes, e.g. crystal violet, methyl violet, violet pure blue, auramine and malachite green.

According to the present invention, it has been found that the colorants which are used in the prior art materials can be replaced by alternatives that are non-inhibiting. Such colorants provide a higher sensitivity, even if the absorption efficiency at the wavelength of the image-wise exposure is not affected thereby.

DETAILED DESCRIPTION OF THE INVENTION

The lithographic printing plate precursor of the present invention contains a hydrophilic support and a coating comprising an oleophilic layer provided thereon. The printing plate precursor is positive-working, i.e. after exposure and development the exposed areas of the oleophilic layer are removed from the support and define hydrophilic (non-printing) areas, whereas the unexposed layer is not removed from the support and defines an oleophilic (printing) area.

The support has a hydrophilic surface or is provided with a hydrophilic layer. The support may be a sheet-like material such as a plate or it may be a cylindrical element such as a sleeve which can be slid around a print cylinder of a printing press. Preferably, the support is a metal support such as aluminum or stainless steel.

A particularly preferred lithographic support is an electrochemically grained and anodized aluminum support. The anodized aluminum support may be treated to improve the hydrophilic properties of its surface. For example, the aluminum support may be silicated by treating its surface with a sodium silicate solution at elevated temperature, e.g. 95° C. Alternatively, a phosphate treatment may be applied which involves treating the aluminum oxide surface with a phosphate solution that may further contain an inorganic fluoride. Further, the aluminum oxide surface may be rinsed with a citric acid or citrate solution. This treatment may be carried out at room temperature or may be carried out at a slightly elevated temperature of about 30 to 50° C. A further interesting treatment involves rinsing the aluminum oxide surface with a bicarbonate solution. Still further, the aluminum oxide surface may be treated with polyvinylphosphonic acid, polyvinylmethylphosphonic acid, phosphoric acid esters of polyvinyl alcohol, polyvinylsulfonic acid, polyvinylbenzenesulfonic acid, sulfuric acid esters of polyvinyl alcohol, and acetals of polyvinyl alcohols formed by reaction with a sulfonated aliphatic aldehyde It is further evident that one or more of these post treatments may be carried out alone or in combination. More detailed descriptions of these treatments are given in GB-A- 1 084 070, DE-A- 4 423 140, DE-A- 4 417 907, EP-A- 659 909, EP-A- 537 633, DE-A- 4 001 466, EP-A- 292 801, EP-A- 291 760 and U.S. Pat. No. 4,458,005.

According to another embodiment, the support can also be a flexible support, which is provided with a hydrophilic layer, hereinafter called 'base layer'. The flexible support is e.g. paper, plastic film, thin aluminum or a laminate thereof. Preferred examples of plastic film are polyethylene terephthalate film, polyethylene naphthalate film, cellulose acetate film, polystyrene film, polycarbonate film, etc. The plastic film support may be opaque or transparent.

The base layer is preferably a cross-linked hydrophilic layer obtained from a hydrophilic binder cross-linked with a hardening agent such as formaldehyde, glyoxal, polyisocyanate or a hydrolyzed tetra-alkylorthosilicate. The latter is particularly preferred. The thickness of the hydrophilic base layer may vary in the range of 0.2 to 25 μm and is preferably 1 to 10 μm.

The hydrophilic binder for use in the base layer is e.g. a hydrophilic (co)polymer such as homopolymers and copolymers of vinyl alcohol, acrylamide, methylol acrylamide, methylol methacrylamide, acrylate acid, methacrylate acid, hydroxyethyl acrylate, hydroxyethyl methacrylate or maleic anhydride/vinylmethylether copolymers. The hydrophilicity of the (co)polymer or (co)polymer mixture used is preferably the same as or higher than the hydrophilicity of polyvinyl acetate hydrolyzed to at least an extent of 60% by weight, preferably 80% by weight.

The amount of hardening agent, in particular tetraalkyl orthosilicate, is preferably at least 0.2 parts per part by weight of hydrophilic binder, more preferably between 0.5 and 5 parts by weight, most preferably between 1 parts and 3 parts by weight.

The hydrophilic base layer may also contain substances that increase the mechanical strength and the porosity of the layer. For this purpose colloidal silica may be used. The colloidal silica employed may be in the form of any commercially available water dispersion of colloidal silica for example having an average particle size up to 40 nm, e.g; 20 nm. In addition inert particles of larger size than the colloidal silica may be added e.g. silica prepared according to Stöber as described in J. Colloid and Interface Sci., Vol. 26, 1968, pages 62 to 69 or alumina particles or particles having an average diameter of at least 100 nm which are particles of titanium dioxide or other heavy metal oxides. By incorporating these particles the surface of the hydrophilic base layer is given a uniform rough texture consisting of microscopic hills and valleys, which serve as storage places for water in background areas.

Particular examples of suitable hydrophilic base layers for use in accordance with the present invention are disclosed in EP-A- 601 240, GB-P- 1 419 512, FR-P- 2 300 354, U.S. Pat. Nos. 3,971,660, and 4,284,705.

It is particularly preferred to use a film support to which an adhesion improving layer, also called support layer, has been provided. Particularly suitable adhesion improving layers for use in accordance with the present invention comprise a hydrophilic binder and colloidal silica as disclosed in EP-A- 619 524, EP-A- 620 502 and EP-A- 619 525. Preferably, the amount of silica in the adhesion improving layer is between 200 $mg/m^2$ and 750 $mg/m^2$. Further, the ratio of silica to hydrophilic binder is preferably more than 1 and the surface area of the colloidal silica is preferably at least 300 $m^2$/gram, more preferably at least 500 $m^2$/gram.

The oleophilic layer contains a polymer that is soluble in an aqueous alkaline developer. Preferred polymers are phenolic resins which are soluble in an aqueous developer, preferably having a pH between 7.5 and 14. Suitable polymers are e.g. novolac, resoles, polyvinyl phenols and carboxy-substituted polymers. Typical examples of such polymers are described in DE-A-4007428, DE-A-4027301 and DE-A-4445820.

According to the present invention, the oleophilic layer also contains an organic dye which absorbs visible light so that a perceptible image is obtained upon image-wise exposure and subsequent development. The term "organic dye" shall be understood as excluding pigments and metal ion complexes. Preferably, the dye has an absorption maximum in the visible wavelength region (380-750 nm). The dye may also absorb the infrared light that can be used for the image-wise exposure. In an alternative embodiment, the dye does not substantially absorb the light that may be used for the image-wise exposure and then it is advantageous to add an additional sensitizer to the coating that is capable of absorbing the light used for the image-wise exposure. The latter sensitizer is discussed in more detail below. Although the dye absorbs visible light, it preferably does not sensitize the printing plate precursor, i.e. the coating does not become more soluble in the developer upon exposure to visible light. In a preferred daylight stable embodiment, the coating does not comprise photosensitive ingredients, such as diazide or diazonium compounds, photoacids, photoinitiators, sensitisers etc., which absorb the near UV and/or visible light that is present in sun light or office lighting and thereby render the coating more soluble in exposed areas.

The dyes in the materials of the present invention are non-inhibiting, i.e. they do not reduce the solubility of the above polymer in an aqueous alkaline developer. "Reducing the solubility of the polymer" shall be understood as reducing the dissolution rate of the polymer in the developer, rather than reducing the concentration of the dissolved polymer in equilibrium conditions. As explained above, a positive working material shows a faster dissolution of the oleophilic layer at exposed areas than at unexposed areas. Preferably, the exposed areas are completely dissolved in the developer before the unexposed areas are attacked so that the latter are characterized by sharp edges and high ink-acceptance. It may be concluded that the solubility differentiation between exposed and unexposed areas of the coating is induced by a kinetic rather than a thermodynamic effect.

The inhibiting capability of the dye can easily be tested by coating two samples of the oleophilic layer on a support: the reference sample contains only the polymer and another includes both the polymer (in equal amounts as the reference) as well as the dye. A series of unexposed samples is immersed in an aqueous alkaline developer, each sample during a different time period. After the immersion period, the sample is removed from the developer, immediately rinsed with water, dried and then the dissolution of the coating in the developer is measured by comparing the weight of the sample before and after the development. As soon as the coating is dissolved completely, no more weight loss is measured upon longer immersion time periods, i.e. a curve representing weight loss as a function of immersion time reaches a plateau from the moment of complete dissolution of the layer, which is referred to herein as "dissolution time". When the dissolution time of the sample containing the dye is longer than the dissolution time of the sample without the dye, then the dye clearly acts as an inhibitor. When the dissolution time of the sample containing the dye is not longer than the value of the reference sample, then the dye is non-inhibiting and, as a result, does not reduce the solubility of the oleophilic layer in the developer.

The dye preferably has a chemical structure, wherein a chromophoric group, which absorbs visible light is substituted by one or more solubilizing groups, as shown in the following formula:

$$D\text{-}[(L)_x\text{-}(G)_y]_n$$

wherein D is a chromophoric group, L is a divalent linking group, x is 0 or 1, y and n are at least 1, and G is an anionic group or a group which can be rendered anionic by immersion of the coating in an aqueous alkaline solution. G is preferably selected from the group consisting of —COOH, —OH, —$PO_3H_2$, —O—$PO_3H_2$, —$SO_3H$, —O—$SO_3H$, —$SO_2$—$NH_2$, —$SO_2$—NH—R, —$SO_2$—NH—CO—R and salts thereof, R being an optionally substituted alkyl or optionally substituted aryl group. L is e.g. a group which comprises —O—, —CO—O—, —O—CO—, —N=N—, —NR'—, —CO—NR'—, —NR'—CO—, optionally substituted arylene or optionally substituted alkylene, R' being hydrogen, optionally substituted alkyl or optionally substituted aryl. When x=0, then G is directly bonded to the chromophoric group D. When x=1, then y may be larger than 1, i.e. the same linking group may carry more than one anionic group. Each L and G can be independently selected from the other L and G groups. Dyes wherein one or more anionic groups G are directly bonded to D and wherein one or more other anionic group G are coupled to D by means of a linking group L also belong to the scope of the present invention.

Suitable dyes correspond e.g. to one of the following formula:

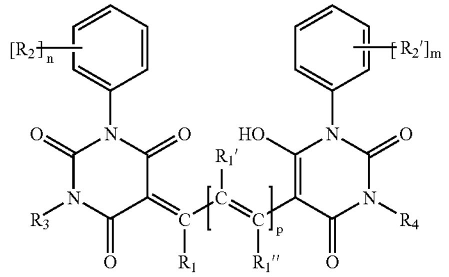

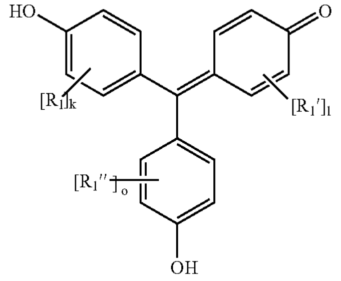

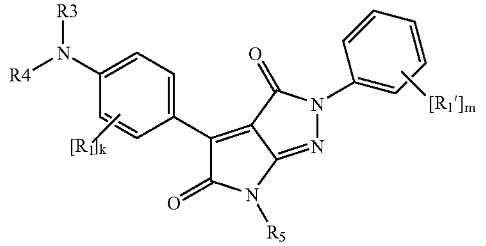

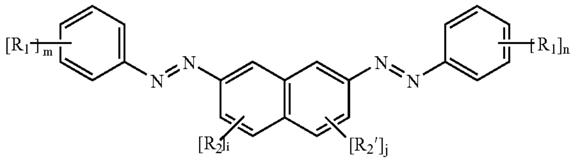

wherein i and j are independently 0 to 3;

k, l and o are independently 0 to 4;

m and n are independently 0 to 5;

p is 0 to 3;

$R_1$, $R_1'$, $R_1''$, $R_2$ and $R_2'$ are independently selected from the group consisting of optionally substituted alkyl, optionally substituted aryl, -G, -L-G, —CN, a halogen, —$NO_2$, —$OR_d$, —CO—O—$R_a$, —O—CO—$R_a$, —CO—$NR_dR_e$, —$NR_dR_e$, —$NR_d$—CO—$R_a$, —$NR_d$—CO—O—$R_a$, —$NR_d$—CO—$NR_eR_f$, —$SO_2$—O—$R_a$, —$SO_2$—$NR_dR_e$ or wherein two adjacent radicals $R_1$, $R_1'$, $R_1''$, $R_2$ or $R_2'$ together form a condensed carbocyclic or heterocyclic ring;

R3, R4 and R5 are independently selected from the group consisting of hydrogen, optionally substituted alkyl, optionally substituted aryl, —CO—$R_b$, —CO—O—$R_b$, —CO—$NR_fR_g$ and -L-G; with L and G as defined above.

$R_a$ and $R_b$ being an optionally substituted alkyl or an optionally substituted aryl group;

$R_d$, $R_e$, $R_f$ and $R_g$ being hydrogen, an optionally substituted alkyl or an optionally substituted aryl group.

Specific examples of such dyes are the following:

Dye 1

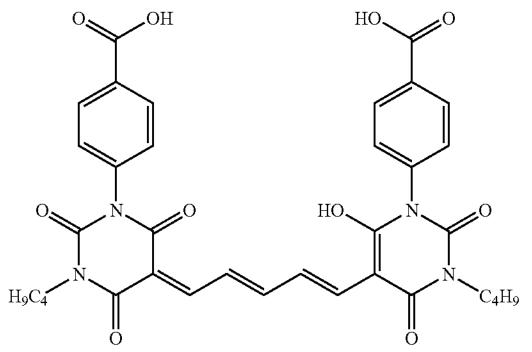

Dye 2

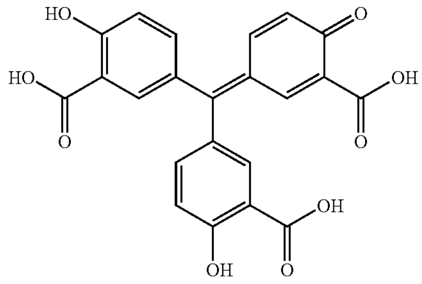

Dye 3

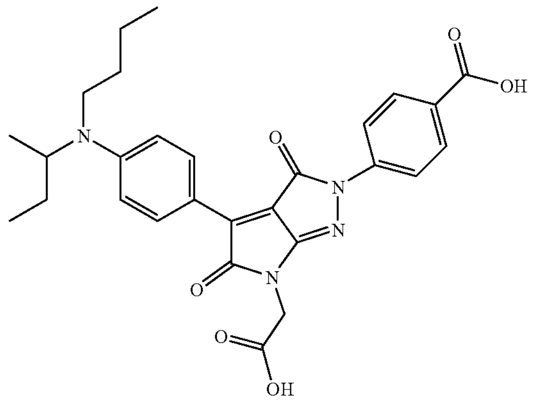

The non-inhibiting dye is present in an amount sufficient to give the coating a visible color. It is self evident that the required amount depends on the extinction coefficient of the dye. The concentration of a typical non-inhibiting dye in the oleophilic layer may vary e.g. between 0.25 and 10.0 wt. % relative to the oleophilic layer, more preferably between 0.5 and 5.0 wt. %.

The oleophilic layer may further contain other ingredients, e.g. additional binders to improve the run length of the plate, such as those described in EP-A 933 682. Preferably, also development accelerators are included, i.e. compounds which act as dissolution promoters because they are capable of reducing the dissolution time of the oleophilic layer, which can be tested by the same procedure as describe above in relation to the inhibiting capability of the dye. For example, cyclic acid anhydrides, phenols or organic acids can be used in order to improve the aqueous developability. Examples of the cyclic acid anhydride include phthalic anhydride, tetrahydrophthalic anhydride, hexahydrophthalic anhydride, 3,6-endoxy-4-tetrahydrophthalic anhydride, tetrachlorophthalic anhydride, maleic anhydride, chloromaleic anhydride, alpha-phenylmaleic anhydride, succinic anhydride, and pyromellitic anhydride, as described in U.S. Pat. No. 4,115,128. Examples of the phenols include bisphenol A, p-nitrophenol, p-ethoxyphenol, 2,4,4'-trihydroxybenzophenone, 2,3,4-trihydroxy-benzophenone, 4-hydroxybenzophenone, 4,4',4"-trihydroxy-triphenylmethane, and 4,4',3",4"-tetrahydroxy-3,5,3',5'-tetramethyltriphenyl-methane, and the like. Examples of the organic acids include sulfonic acids, sulfonic acids, alkylsulfuric acids, phosphonic acids, phosphates, and carboxylic acids, as described in, for example, JP-A Nos. 60-88,942 and 2-96,755. Specific examples of these organic acids include p-toluenesulfonic acid, dodecylbenzenesulfonic acid, p-toluenesulfinic acid, ethylsulfuric acid, phenylphosphonic acid, phenylphosphinic acid, phenyl phosphate, diphenyl phosphate, benzoic acid, isophthalic acid, adipic acid, p-toluic acid, 3,4-dimethoxybenzoic acid, phthalic acid, terephthalic acid, 4-cyclohexene-1,2-dicarboxylic acid, erucic acid, lauric acid, n-undecanoic acid, and ascorbic acid. The amount of the cyclic acid anhydride, phenol, or organic acid contained in the image forming composition is preferably in the range of 0.05 to 20% by weight.

In a preferred embodiment, the coating also contains developer resistance means, i.e. one or more materials which prevent penetration of the aqueous alkaline developer into the oleophilic layer at unexposed areas. Such developer resistance means can be added to the oleophilic layer or in a barrier layer provided on top of the oleophilic layer. In the latter embodiment, the solubility of the barrier layer in the developer or the penetrability of the barrier layer by the developer can be reduced by exposure to heat or infrared light, as described in e.g. EP-A 864 420, EP-A 950 517 and WO99/21725. Preferred examples of the developer resistance means include water-repellent polymers such as a polymer comprising siloxane and/or perfluoroalkyl units. In one embodiment, the barrier layer contains such a water-repellent polymer in an amount between 0.5 and 25 $mg/m^2$, preferably between 0.5 and 15 $mg/m^2$ and most preferably between 0.5 and 10 $mg/m^2$. When the water-repellent polymer is also ink-repelling, e.g. in the case of polysiloxanes, higher amounts than 25 $mg/m^2$ can result in poor ink-acceptance of the non-exposed areas. An amount lower than 0.5 $mg/m^2$ on the other hand may lead to an unsatisfactory development resistance. The polysiloxane may be a linear, cyclic or complex cross-linked polymer or copolymer. The term polysiloxane compound shall include any compound which contains more than one siloxane group —Si(R,R')—O—, wherein R and R' are optionally substituted alkyl or aryl groups. Preferred siloxanes are phenylalkylsiloxanes and dialkylsiloxanes. The number of siloxane groups in the (co)polymer is at least 2, preferably at least 10, more preferably at least 20. It may be less than 100, preferably less than 60. In another embodiment, the water-repellant polymer is a block-copolymer or a graft-copolymer of a poly (alkylene oxide) and a polymer comprising siloxane and/or perfluoroalkyl units. A suitable copolymer comprises about 15 to 25 siloxane units and 50 to 70 alkyleneoxide groups. Preferred examples include copolymers comprising phenylmethylsiloxane and/or dimethylsiloxane as well as ethylene oxide and/or propylene oxide, such as Tego Glide 410, Tego Wet 265, Tego Protect 5001 or Silikophen P50/X, all commercially available from Tego Chemie, Essen, Germany. Such a copolymer acts as a surfactant which upon coating, due to its bifunctional structure, automatically positions itself at the interface between the coating and air and thereby forms a separate top layer even when applied as an ingredient of the coating solution of the oleophilic layer. Simultaneously, such surfactants act as a spreading agent which improves the coating quality. Alternatively, the water-repellent polymer can be applied in a second solution, coated on top of the oleophilic layer. In that embodiment, it may be advantageous to use a solvent in the second coating solution that is not capable of dissolving the ingredients present in the first layer so that a highly concentrated water-repellent phase is obtained at the top of the material.

The material can be image-wise exposed directly with heat, e.g. by means of a thermal head, or indirectly by infrared light, which is converted into heat by a light absorbing compound. Near infrared light is preferred. Said light absorbing compound can be the non-inhibiting dye discussed above. The coating preferably comprises, in addition to the non-inhibiting dye, a sensitizer which is a dye or pigment having an absorption maximum in the IR wavelength range. The concentration of the sensitizing dye or pigment in the oleophilic layer is typically between 0.25 and 10.0 wt. %, more preferably between 0.5 and 7.5 wt. % relative to said layer.

Preferred IR-absorbing compounds are dyes such as cyanine or merocyanine dyes or pigments such as carbon black. A suitable compound is the following infrared dye:

IR-1

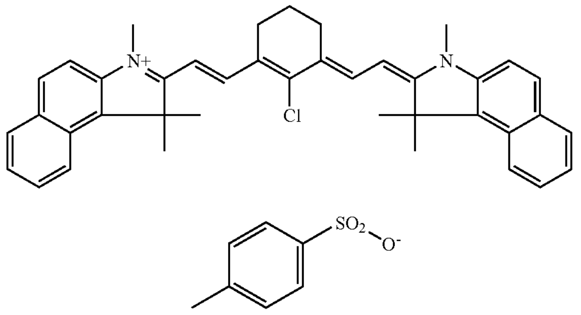

The sensitizing dye or pigment may be present in the oleophilic layer, in the barrier layer-discussed above or in an optional other layer. According to a highly preferred embodiment, the dye or pigment is concentrated in or near the barrier layer, e.g. in an intermediate layer between the oleophilic and the barrier layer. According to that embodiment, said intermediate layer comprises the light absorbing compound in an amount higher than the amount of light absorbing compound in the oleophilic or in the barrier layer. In a preferred embodiment, the barrier layer consists essentially of water-repellent polymer, i.e. comprises no effective amount of sensitizer or other ingredients.

The printing plate precursor of the present invention can be exposed to heat or to infrared light, e.g. by means of a thermal head, LEDs or a laser. Most preferably, the light used for the exposure is a laser emitting near infrared light having a wavelength in the range from about 750 to about 1500 nm is used, such as a semiconductor laser diode, a Nd:YAG or a Nd:YLF laser. The required laser power depends on the sensitivity of the image-recording layer, the pixel dwell time of the laser beam, which is determined by the spot diameter (typical value of modern plate-setters at $1/e^2$ of maximum intensity: 10-25 μm), the scan speed and the resolution of the exposure apparatus (i.e. the number of addressable pixels per unit of linear distance, often expressed in dots per inch or dpi; typical value: 1000-4000 dpi).

Two types of laser-exposure apparatuses are commonly used: internal (ITD) and external drum (XTD) plate-setters. ITD plate-setters for thermal plates are typically characterized by a very high scan speed up to 500 m/sec and may require a laser power of several Watts. XTD plate-setters for thermal plates having a typical laser power from about 200 mW to about 1 W operate at a lower scan speed, e.g. from 0.1 to 10 m/sec.

The known plate-setters can be used as an off-press exposure apparatus, which offers the benefit of reduced press down-time. XTD plate-setter configurations can also be used for on-press exposure, offering the benefit of immediate registration in a multi-color press. More technical details of on-press exposure apparatuses are described in e.g. U.S. Pat. Nos. 5,174,205 and 5,163,368.

In the development step, the non-image areas of the coating are removed by immersion in an aqueous alkaline developer, which may be combined with mechanical rubbing, e.g. by a rotating brush. The development step may be followed by a rinsing step, a gumming step, a drying step and/or a post-baking step.

The printing plate thus obtained can be used for conventional, so-called wet offset printing, in which ink and an aqueous dampening liquid is supplied to the plate. Another suitable printing method uses so-called single-fluid ink without a dampening liquid. Single-fluid inks which are suitable for use in the method of the present invention have been described in U.S. Pat. Nos. 4,045,232; 4,981,517 and 6,140,392. In a most preferred embodiment, the single-fluid ink comprises an ink phase, also called the hydrophobic or oleophilic phase, and a polyol phase as described in WO 00/32705.

EXAMPLES

Preparation of the Support

A 0.30 mm thick aluminum foil was degreased by immersing the foil in an aqueous solution containing 5 g/l of sodium hydroxide at 50° C. and rinsed with demineralized water. The foil was then electrochemically grained using an alternating current in an aqueous solution containing 4 g/l of hydrochloric acid, 4 g/l of hydroboric acid and 5 g/l of aluminum ions at a temperature of 35° C. and a current density of 1200 $A/m^2$ to form a surface topography with an average center-line roughness Ra of 0.5 μm.

After rinsing with demineralized water the aluminum foil was then etched with an aqueous solution containing 300 g/l of sulfuric acid at 60° C. for 180 seconds and rinsed with demineralized water at 25° C. for 30 seconds.

The foil was subsequently subjected to anodic oxidation in an aqueous solution containing 200 g/l of sulfuric acid at a temperature of 45° C., a voltage of about 10 V and a current density of 150 $A/m^2$ for about 300 seconds to form an anodic oxidation film of 3.00 $g/m^2$ of $Al_2O_3$ then washed with demineralized water, post-treated with a solution containing polyvinylphosphonic acid and subsequently with a solution containing aluminum trichloride, rinsed with demineralized water at 20° C. during 120 seconds and dried.

Test of Inhibiting Capability of Dyes

A layer of novolac (Alnovol SPN452 from Clariant, a 40.5 wt. % solution in methoxypropanol) and the dyes specified in Table 1 were coated on the above support. After drying during 2 min at 120° C., the samples contained 0.9 $g/m^2$ of novolac. The samples were then dipped in an ozasol EP26 developer from Agfa at 20° C. and the dissolution time was determined as described above. Examples 2-4 contained a dye according to the invention and showed shorter dissolution time values than Reference Example 1 without dye. Comparative Example 5 contained Resolin Rot F3BS, which is an inhibiting dye, inducing a longer dissolution time than for the materials of the present invention.

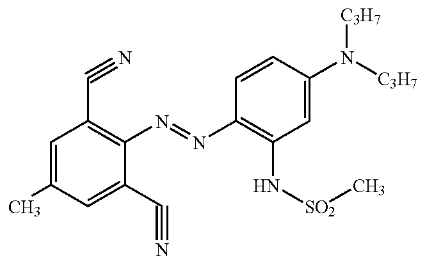

Resolin Rot F3BS

TABLE 1

| Example no. | Dye ($mg/m^2$) | Dissolution time (sec) |
|---|---|---|
| 1 (reference) | — | 40 |
| 2 (invention) | Dye 1 (20) | 20 |
| 3 (invention) | Dye 2 (20) | 20 |
| 4 (invention) | Dye 3 (20) | 20 |
| 5 (comparative) | Resolin Rot F3BS (12.5) | 60 |

TABLE 2

| Ingredients (g) | Ex. 6 (inv) | Ex. 7 (inv.) | Ex. 8 (inv.) | Ex. 9 (comp.) |
|---|---|---|---|---|
| Tetrahydrofuran | 186.2 | = | = | 207.12 |
| Alnovol SPN452 | 103.7 | = | = | 116.29 |
| Methoxypropanol | 439.93 | = | = | 376.56 |
| Methylethylketon | 236.93 | = | = | 263.55 |
| IR-1 | 2.27 | = | = | 2.53 |
| Dye 1 | 1.00 | — | — | — |
| Dye 2 | — | 1.00 | — | — |
| Dye 3 | — | — | 1.00 | — |
| Resolin Rot F3BS | — | — | — | 1.75 |
| Tego Glide 410 * | 0.25 | = | = | = |
| 2,3,4-trihydroxy-benzophenone | 7.26 | = | = | 8.08 |
| IR sensitivity ($mJ/cm^2$) | ≦79 | = | = | 157 |

* Surfactant commercially available from Tego Chemie, Essen, Germany

Plate Precursor Materials

The solutions in Table 2 were coated on the above support at a wet coating thickness of 22 μm and then dried during 2 min at 120° C. The materials were then imaged on a Creo Trendsetter 3244 (830 nm) using the following series of energy density settings (power at the image plane): 79 $mJ/cm^2$, 99 $mJ/cm^2$, 125 $mJ/cm^2$, 157 $mJ/cm^2$, and 197 $mJ/cm^2$. The plates were then processed in an Agfa Autolith PN85 processor operating at a speed of 0.84 m/min using Agfa Ozasol EP26 developer at 25° C. and finally gummed with Agfa Ozasol RC795. The IR-sensitivity was defined as the energy density that is required to obtain a 50% light absorption, measured on the developed plate at the wavelength maximum of the dye, in areas which have been exposed with a dot area of a 50% screen (@200 lpi).

The results in Table 2 indicate that the non-inhibiting dyes Dye 1-3 provide a higher sensitivity (given by the lower energy density) than the inhibiting dye Resolin Rot F3BS.

We claim:

1. A heat-sensitive lithographic printing plate precursor comprising (i) a support having a hydrophilic surface or which is provided with a hydrophilic layer; and (ii) a coating provided thereon, the coating comprising an oleophilic layer which, upon image-wise exposure to heat or infrared light and subsequent immersion in an aqueous alkaline developer, dissolves in the developer at a higher dissolution rate in exposed areas than in unexposed areas, wherein the oleophilic layer comprises a polymer that is soluble in the developer and an organic dye in a amount sufficient to provide a visible color to the coating and wherein said organic dye does not reduce the dissolution rate of the unexposed areas in the developer, wherein the organic dye has a chemical structure according to the following formula:

$$D\text{-}[(L)_x\text{-}(G)_y]_n$$

wherein D is a chromophoric group, L is a divalent linking group, x is 0 or 1, y and n are at least 1, and G is an anionic group or a group which can be rendered anionic by immersion of the coating in the developer, wherein the organic dye is one of the following formulas:

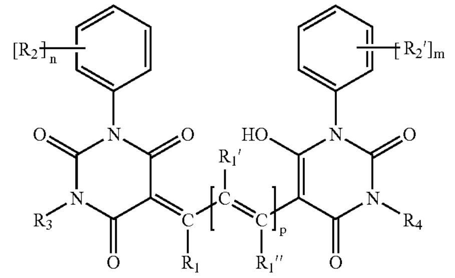

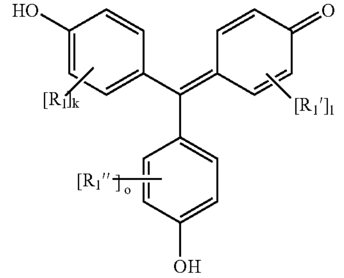

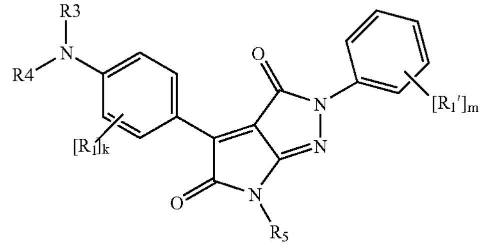

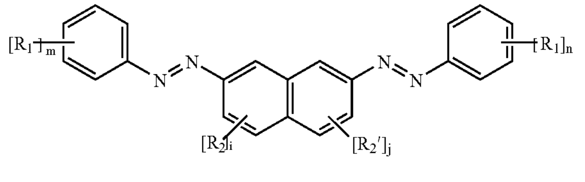

wherein i and j are independently 0 to 3;

k, l and o are independently 0 to 4;

m and n are independently 0 to 5;

p is 0 to 3;

$R_1$, $R_1'$, $R_1''$, $R_2$ and $R_2'$ are independently selected from the group consisting of optionally substituted alkyl, optionally substituted aryl, -G, -L-G, —CN, a halogen, $—NO_2$, $—OR_d$, $—CO—O—R_a$, $—O—CO—R_a$, $—CO—NR_dR_e$, $—NR_dR_e$, $—NR_d—CO—R_a$, $—NR_d—CO—O—R_a$, $—NR_d—CO—NR_eR_f$, $—SO_2—O—R_a$, $—SO_2—NR_dR_e$ or wherein two adjacent radicals $R_1$, $R_1'$, $R_1''$, $R_2$ or $R_2'$ together form a condensed carbocyclic or heterocyclic ring;

R3, R4 and $R_5$ are independently selected from the group consisting of hydrogen, optionally substituted alkyl, optionally substituted aryl, $—CO—R_b$, $—CO—O—R_b$, $—CO—NR_fR_g$ and -L-G;

with $R_a$ and $R_b$ being an optionally substituted alkyl or an optionally substituted aryl group;

$R_d$, $R_e$, $R_f$ and $R_g$ being hydrogen, an optionally substituted alkyl or an optionally substituted aryl group;

wherein G is independently selected from the group consisting of —COOH, —OH, $—PO_3H_2$, $—O—PO_3H_2$, $—SO_3H$, $—O—SO_3H$, $—SO_2—NH_2$, $—SO_2—NH—R$, $—SO_2—NH—CO—R$ and salts thereof, R being an optionally substituted alkyl or optionally substituted aryl group.

2. A lithographic printing plate precursor according to claim 1, wherein the oleophilic layer further comprises a compound which increases the dissolution rate of unexposed areas in the developer.

3. A lithographic printing plate precursor according to claim 2 wherein the compound, which increases the dissolution rate of unexposed areas, is a cyclic acid anhydride, a phenol or an organic acid.

4. A lithographic printing plate precursor according to claim 1, wherein the coating further comprises means for providing increased developer resistance of the coating, and wherein the developer resistance of the coating is reduced upon exposure to heat or infrared light.

5. A lithographic printing plate precursor according to claim 1, wherein the coating further comprises a barrier layer provided on top of the oleophilic layer and the barrier layer comprising means for providing increased developer resistance and wherein the solubility of the barrier layer in the developer or the penetrability of the barrier layer by the developer is reduced upon exposure to heat or infrared light.

6. A lithographic printing plate precursor according to claim 4 wherein the means for providing increased developer resistance comprise a water-repellent polymer.

7. A lithographic printing plate precursor according to claim 6 wherein the water-repellent polymer is a polymer comprising siloxane and/or perfluoroalkyl units; or a block- or graft-copolymer of a poly(alkylene oxide) and a polymer comprising siloxane and/or perfluoroalkyl units.

8. A lithographic printing plate precursor according to claim 5 wherein the means for providing increased developer resistance comprise a water-repellent polymer.

9. A lithographic printing plate precursor according to claim 8 wherein the water-repellent polymer is a polymer comprising siloxane and/or perfluoroalkyl units; or a block- or graft-copolymer of a poly(alkylene oxide) and a polymer comprising siloxane and/or perfluoroalkyl units.

* * * * *